United States Patent
Ohlhausen et al.

[11] Patent Number: 6,083,360
[45] Date of Patent: Jul. 4, 2000

[54] SUPPLEMENTAL HEATING OF DEPOSITION TOOLING SHIELDS

[75] Inventors: James A. Ohlhausen; Diane E. Peebles; John A. Hunter; Kenneth H. Eckelmeyer, all of Albuquerque, N. Mex.

[73] Assignee: Sandia Corporation, Albuquerque, N. Mex.

[21] Appl. No.: 09/289,145

[22] Filed: Apr. 8, 1999

[51] Int. Cl.[7] .................................................. C23C 14/54
[52] U.S. Cl. ........................ 204/192.13; 204/298.09; 204/298.11; 204/298.02; 204/192.12; 204/298.03; 204/298.15; 118/723 R; 118/728; 118/641; 118/666; 427/569; 427/570
[58] Field of Search ................... 204/298.09, 192.13, 204/298.11, 298.02, 192.12, 298.03, 298.15; 118/723 R, 728, 641, 666; 427/569, 570

[56] References Cited

U.S. PATENT DOCUMENTS

| | | | |
|---|---|---|---|
| 5,202,008 | 4/1993 | Talieh et al. | 204/192.32 |
| 5,380,414 | 1/1995 | Tepman | 204/192.3 |
| 5,391,275 | 2/1995 | Mintz | 204/192.32 |
| 5,567,909 | 10/1996 | Sugarman et al. | 136/201 |
| 5,598,622 | 2/1997 | Raijmakers | 29/447 |
| 5,630,917 | 5/1997 | Guo | 204/192.12 |
| 5,690,795 | 11/1997 | Rosenstein et al. | 204/192.1 |

FOREIGN PATENT DOCUMENTS

| | | |
|---|---|---|
| 2-8367 | 1/1990 | Japan . |
| 4-365859 | 12/1992 | Japan . |
| 5-247640 | 9/1993 | Japan . |

*Primary Examiner*—Alan Diamond
*Attorney, Agent, or Firm*—George H. Libman

[57] ABSTRACT

A method of reducing particle generation from the thin coating deposited on the internal surfaces of a deposition chamber which undergoes temperature variation greater than 100° C. comprising maintaining the temperature variation of the internal surfaces low enough during the process cycle to keep thermal expansion stresses between the coating and the surfaces under 500 MPa. For titanium nitride deposited on stainless steel, this means keeping temperature variations under approximately 70° C. in a chamber that may be heated to over 350° C. during a typical processing operation. Preferably, a supplemental heater is mounted behind the upper shield and controlled by a temperature sensitive element which provides feedback control based on the temperature of the upper shield.

16 Claims, 5 Drawing Sheets

SUPPLEMENTAL HEATING OF DEPOSITION TOOLING SHIELDS

The United States Government has rights in this invention pursuant to Department of Energy Contract No. DE-AC04-94AL85000 with Sandia Corporation.

CROSS REFERENCE TO RELATED APPLICATIONS (Not Applicable)

BACKGROUND OF THE INVENTION

The present invention utilizes supplemental heating to reduce particle generation in a deposition chamber such as a physical vapor deposition (PVD) chamber.

In a PVD process, a target material is placed within and electrically isolated from a vacuum chamber. A plasma stream is directed onto the target material where the plasma ions dislodge the target material. An electric potential between the target and a specimen attracts the dislodged target material to the specimen, and an even layer of target material coats the specimen.

For example, TiN is deposited as a barrier layer on each side of every metallization layer in semiconductor manufacturing. During the deposition process, TiN is deposited on every surface exposed to the sputtering field, not just to the wafer itself. In order to keep the deposition tooling chambers clean and particle-free, the deposition tooling includes shields that are placed within the deposition chamber to prevent any deposition on the chamber itself. After a number of cycles, the coatings deposited on the deposition shields begin to fracture and produce particles which can fall onto, and contaminate, the specimen. At this point, the manufacturing process must be stopped so the shields can be replaced. Since it takes at least a day to replace the shields and get the chamber back into condition for semiconductor processing, it would be very desirable to extend the number of cycles a chamber could run before particle generation causes the manufacturing process to be stopped.

Much effort has been undertaken to minimize the effects of particle generation from a shield.

U.S. Pat. No. 5,202,008 of Talieh et al. discloses a system where the shield is sputter-etch cleaned prior to use to increase adhesion of deposits by removing oxides which prevent deposits from bonding to the shield and by increasing surface roughness, which also increases the mechanical bonding of the deposits.

U.S. Pat. No. 5,630,917 of Goa describes a two-step chamber plasma cleaning process that is used because a baffle divides the chamber.

U.S. Pat. No. 5,598,622 of Raaijmakers describes a system where heating lamps normally used for chamber bakeout (removing moisture after the chamber is sealed) and mounted under a shield provide internal heating for expanding the shield to contact the inner walls of the deposition chamber, which prevents warping of the shield. The patent notes that excessive thermal expansion (changes in size during processing) may contribute to harmful contamination of the work piece. The patent teaches heating the shield from 50–300° C. above the inner wall of the chamber to maintain contact. There is no teaching in this patent that maintaining the higher temperature may reduce contamination build-up. There is also no indication in this patent that Raaijmakers actually ever applied higher temperatures to his shield, as bake-out lamps are incapable of heating a shield beyond 100° C. Furthermore, heating the entire chamber to 300° C. would cause other difficulties with the manufacturing process.

This invention was conceived and tested in a vacuum chamber manufactured by the Assignee of U.S. Pat. No. 5,598,622. The Endura™ chamber of this Assignee includes a pair of quartz bakeout lamps installed horizontally inside the chamber. These lamps are cylinders installed parallel to each other on opposite sides of the chamber in a horizontal plane, directly under the outer edge of the lower shield. Power is supplied to the lamps during chamber idle, and varies from 0% to 100% of full power. Use of lamps relies on IR radiation which, by its nature, is line of sight. Shield parts which are not directly visible by the lamps are not heated directly. Those parts close to the lamps are heated very much. As discussed hereinafter, the invention provides a significant improvement over this prior art.

SUMMARY OF THE INVENTION

It is an object of this invention to provide supplemental heating to the shields of a deposition chamber to minimize temperature changes during the production cycle. Such heating has been found to significantly and unexpectedly reduce particle generation.

To achieve the foregoing and other objects, and in accordance with the purpose of the present invention, as embodied and broadly described herein, the present invention may comprise a method of reducing particle generation from the thin coating deposited on the internal surfaces of a deposition chamber which undergoes temperature variation greater than 100° C. comprising maintaining the temperature variation of the internal surfaces low enough during the process cycle to keep thermal expansion stresses between the coating and the surfaces under 500 MPa. For titanium nitride deposited on stainless steel, this means keeping temperature variations under approximately 70° C. in a chamber that may be heated to over 350° C. during a typical processing operation.

Additional objects, advantages, and novel features of the invention will become apparent to those skilled in the art upon examination of the following description or may be learned by practice of the invention. The objects and advantages of the invention may be realized and attained as particularly pointed out in the appended claims.

BRIEF DESCRIPTION OF THE DRAWINGS

The accompanying drawings, which are incorporated in and form part of the specification, illustrate an embodiment of the present invention and, together with the description, serve to explain the principles of the invention.

DETAILED DESCRIPTION OF THE INVENTION

Figure 1:
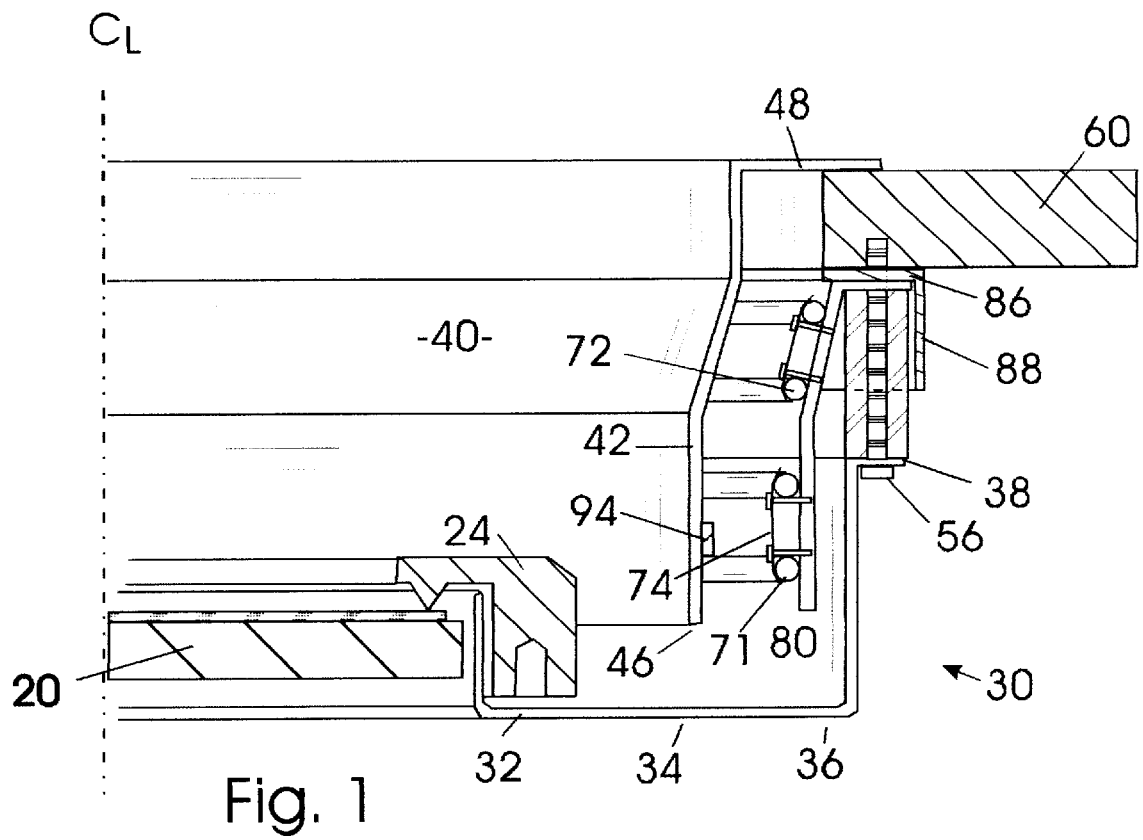
FIG. 1 shows a partial cross section view of a first embodiment of the invention.

FIG. 1 shows a partial cross-section of the interior of a typical physical vapor deposition chamber that is symmetrically disposed about a vertical center line $C_L$. Conventional elements of such a chamber that are shown in FIG. 1 include a circular table 20 that is illustrated in a raised position against a clamp 24 which forms a ring around the perimeter of table 20. Clamp 24 is held by inner edge 32 of lower shield 30, a metal ring that is suspended at outer edge 38 from the bottom of four spacers 58 that are connected by through-screws 56 at their tops to the under side of a flange 60 extending from the inner wall (not shown) of the chamber. (As used herein, the 'outer' side of an annular element is that side facing the nearest chamber wall, and the 'inner' side of an element is that side facing the centerline.) Upper shield 40 is another generally cylindrical ring that has a smaller diameter along body 42 than outer edge 38 of lower shield 30 and which is also suspended by an outwardly extending portion 48 from the upper side of flange 60. Lower edge 46 of upper shield 40 extends towards, but does not contact, lower shield 30 near outer portion 36 of a web connecting outer edge 38 and inner edge 32. Shields 30 and 40 are typically constructed of aluminum, titanium, or stainless steel. However, the material from which these shields are formed is not an integral part of this invention. These components are well known to those of ordinary skill in the art. After the chamber is sealed and baked-out, table 20 is lowered away from clamp 24 to receive a substrate to be coated (not shown). After table 20 is raised to the position shown in FIG. 1 with the substrate against clamp 24, a deposition process such as physical vapor deposition having a source of deposition material (not shown) mounted above table 20 coats the substrate and every other surface in its line of sight with a thin layer of deposition material. Relatively inexpensive shields 30 and 40 prevent excess deposition material from coating the expensive (and difficult to clean) inner walls of the chamber. Table 20 is then lowered and the cycle repeats, with each repetition building up the undesirable coating on clamp 24 and shields 30 and 40. As previously discussed, conventionally, the chamber is opened periodically to permit these elements to be replaced. It is also conventional for a pair of infrared bake-out lamps (not shown) below lower shield 30 to be maintained at low power during idle times of the deposition process to keep the shields from completely cooling off. This heating technique has not been shown to be effective in significantly reducing particle generation.

Figure 3:
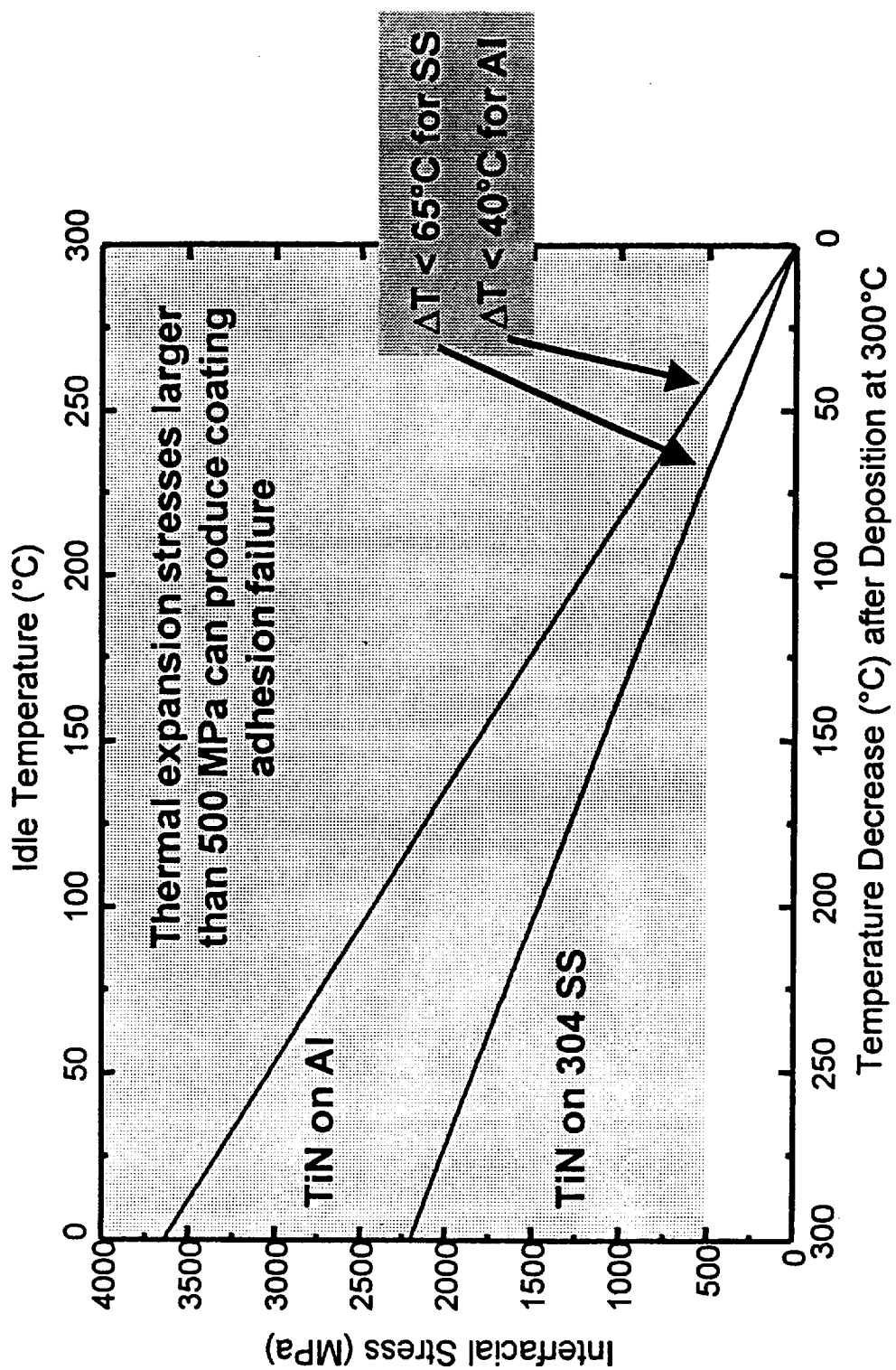
FIG. 3 shows thermal stress as a function of temperature for TiN deposition in chamber materials.

It is known from the literature that thermal expansion stresses larger than 500 MPa can produce coating adhesion failure. These stresses are caused by variations in temperature during a processing cycle. Typically, the internal chamber temperature is maximum during deposition (when energy is applied to vaporize the source), and the temperature is minimum at the beginning and end of the process when the table is lowered. As shown in FIG. 3, the idle temperature in the chamber (the top axis) and the temperature decrease after deposition (the bottom axis) show the calculated thermal expansion stress from a surface in the chamber after deposition of a TiN coating a 350° C. As this figure shows, to keep the stress under 500 MPa, the maximum temperature variation in a stainless steel element should be about 65° C., and the maximum variation in an aluminum element should be about 40° C.

To accomplish this desired goal, it is necessary to determine which element in a deposition chamber has the maximum temperature variation during a processing cycle. Accordingly, the temperature at various points within the chamber was measured during a deposition cycle, where the maximum temperature during deposition was 300° C., and the maximum temperature variation was 200° C. The results of these measurements are shown in FIGS. 4a–d.

Figure 4A:
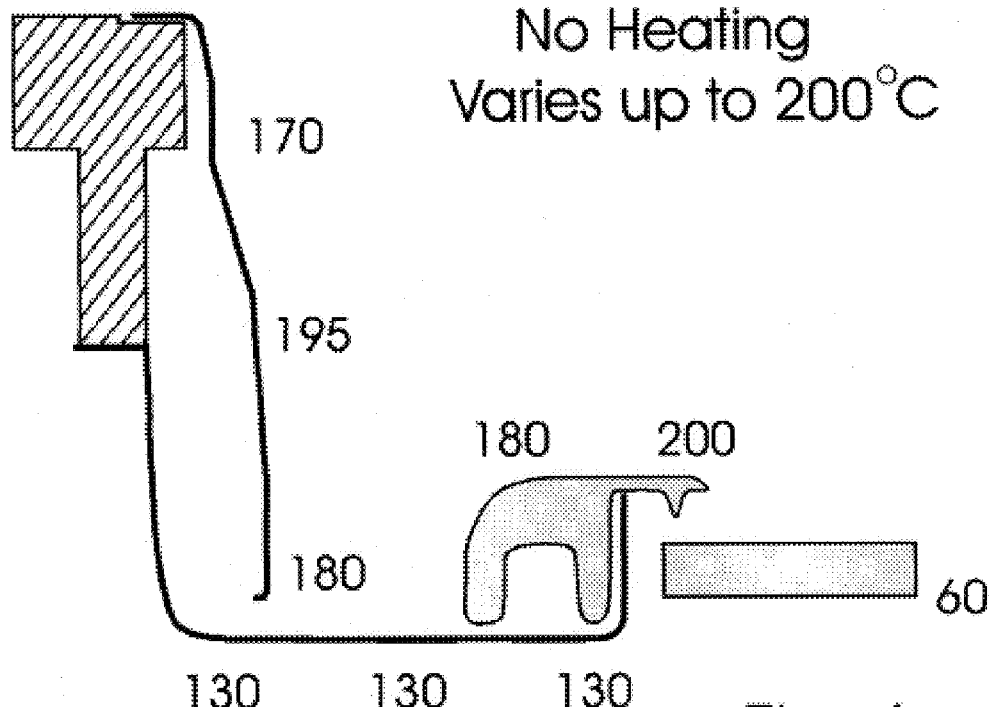
FIGS. 4a–4d show temperature variations in a chamber under various heating conditions during a deposition cycle.
Figure 4B:
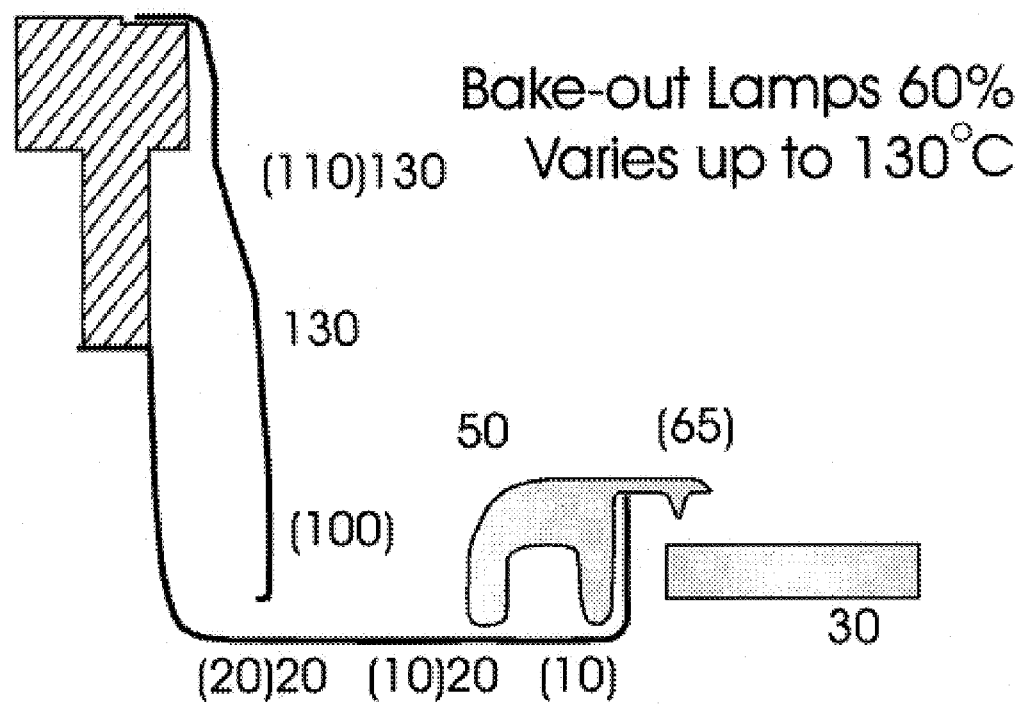

FIG. 4a shows the maximum temperature variations on table 20, clamp 24, lower shield 30 and upper shield 40. With the chamber heated only by the deposition process, temperature variations of 200° C. on the clamp and 195° C. on the upper shield were measured. Both of these temperature variations are of particular concern because the thermal expansion stress at 200° C. is seen from FIG. 3 to be almost three times the acceptable value of 500 MPa, and because both of these elements are above table 20, which permits generated particles to fall onto the specimens on the table.

A first attempt to minimize temperature variations involved running the bake-out lamps below table 20 at 60% power. As would be expected, this easily implemented change raised the temperature of the lower shield 30 and clamp 24, significantly reducing the temperature variation of these elements. However, the maximum temperature variation of upper shield 40 remained between 130 and 110° C. (the lower temperature corresponded to parts of the upper shield directly above the parallel spaced heating lamps; the higher temperature was measured on parts of the shield above the ends of the lamps). Excessive particle generation would still be expected from the upper shield.

Figure 4C:
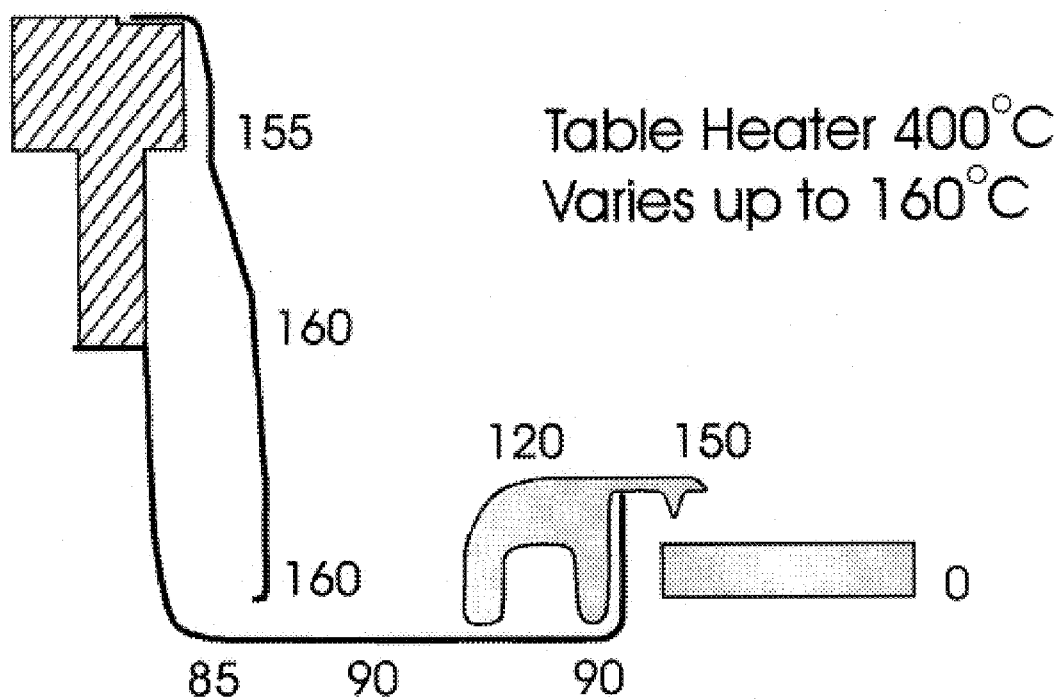

FIG. 4c shows a test where table 20 was held at 400° C. by a heater placed under table 20. Temperature variation on table 20 was reduced to zero, but remained over 150° C. on clamp 24 and upper shield 40.

Figure 4D:
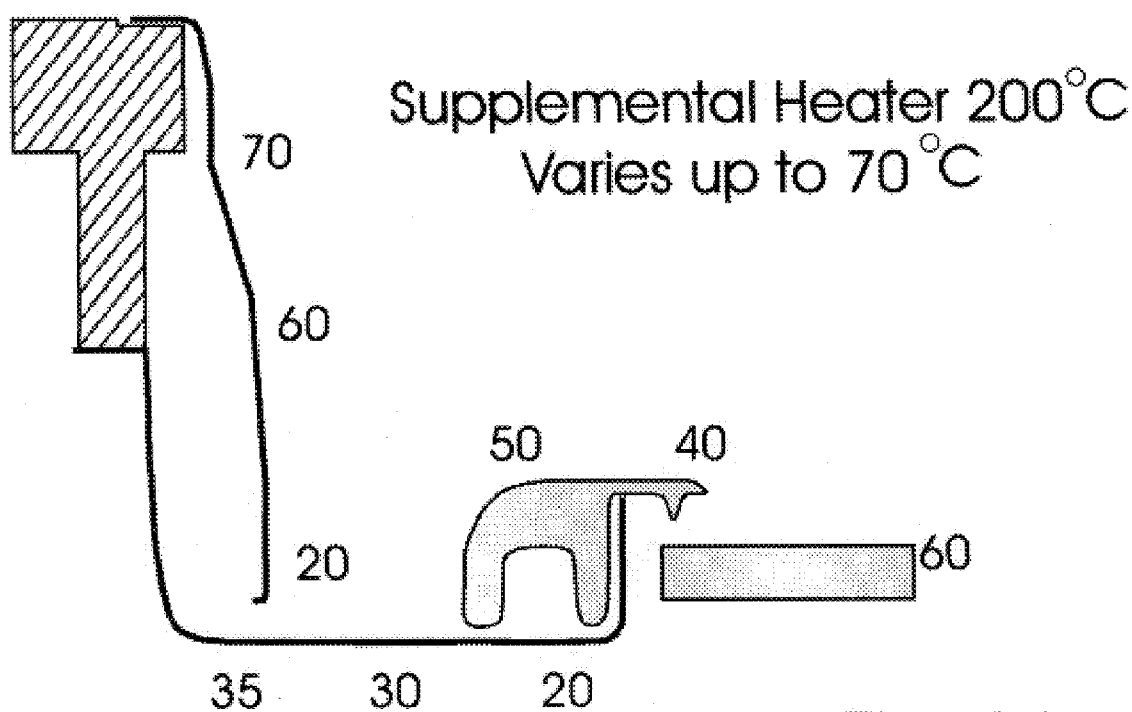

For FIG. 4d, as discussed hereinafter, a thermostatically controlled supplemental heater was placed outside upper shield 40 and used to heat the upper shield to 200° C. The maximum variation for this embodiment was 70° C. at the upper part of the upper shield, an acceptable number for particle generation from stainless steel construction.

Figure 2:
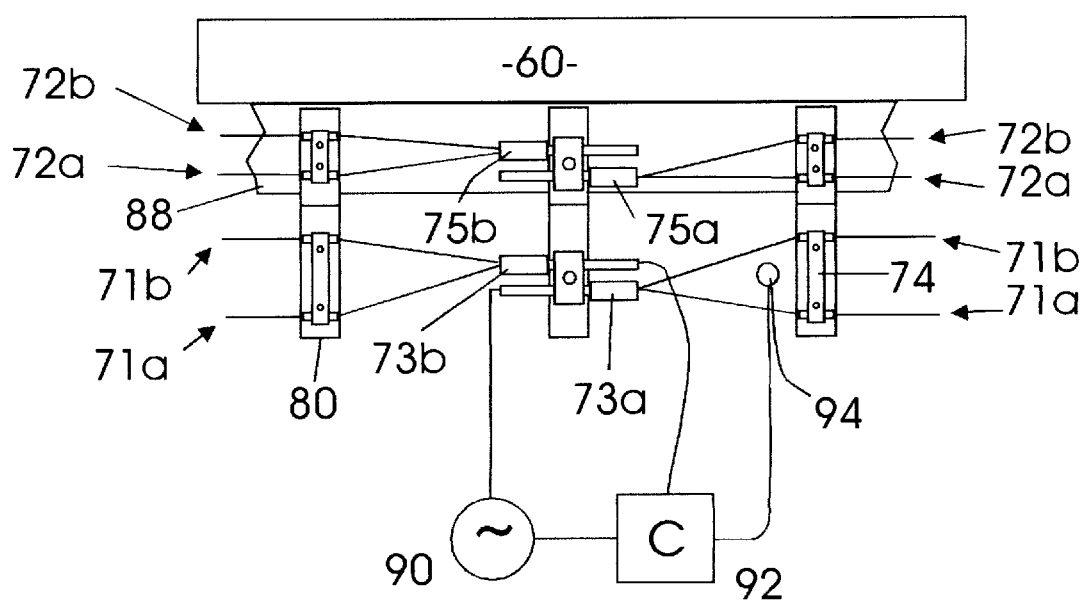
FIG. 2 shows a partial side view of the first embodiment.

As shown in the preferred embodiment FIGS. 1 and 2, a circular supplemental heater 70 for the outer side of upper shield 40 is provided between upper shield 40 and lower shield 30. With feedback from a temperature sensitive element, heater 70 is turned on when the temperature on upper shield 40 is less than 200° C. In this position, heater 70 directly controls the temperature variation of the upper shield, the element most likely to generate particles, while it is protected from the deposition material by that same shield.

The preferred embodiment is mounted from a metal ring 86 having an angular cross section fastened to the underside of flange 60 by screw 56, which screw also fastens outer end 38 of lower shield 30 to the lower end of spacer 58. Sixteen flat, enlongated supports 80 are spaced around the chamber, each support having an upper end fastened to ring 86, an inner surface spaced from and facing the outer surface of upper shield 40, and an outer surface facing and spaced from spacers 58, the outer edge 38 of lower shield 30, and the downwardly extending portion 88 of ring 86. Heater 70 includes at least one resistive wire heater wire 71 extending around the chamber by being rigidly mounted to supports 80 by insulating clamps 74. In the disclosed embodiment, heater 70 comprises two sets of resistive wires, each set having two wires. The lower set consists of wires 71a and 71b extending from a first electrical contact 73a to a second electrical contact 73b fastened to one of insulators 80. The upper set consists of wires 72a and 72b extending between electrical contacts 75a and 75b on a support 80. Each set of wires is connected to a source of electric power 90 through a control circuit 92 in a manner that is well known to those of ordinary skill in the art. Control circuit 92 includes a thermocouple 94 that may be mounted on the outer surface of upper shield 40.

Figure 5:
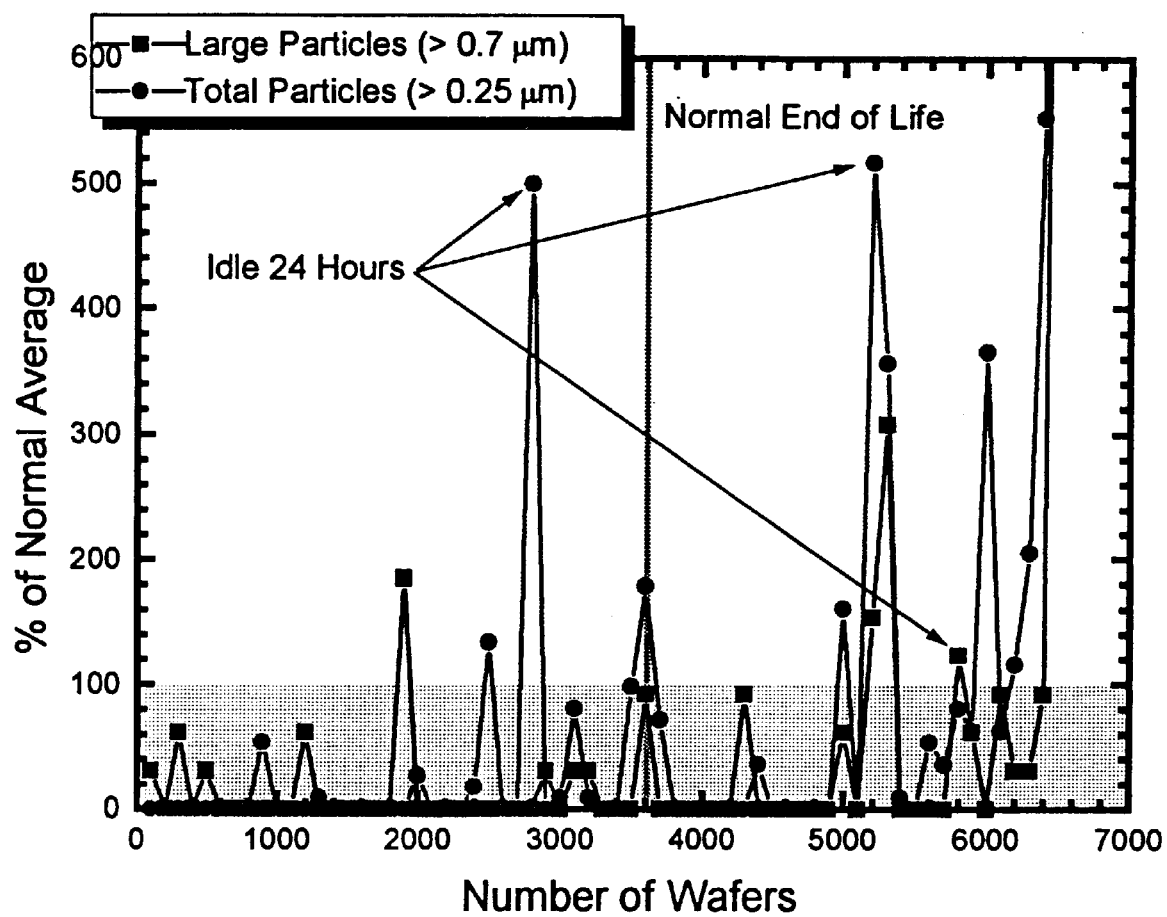
FIG. 5 shows the reduction in the number of particles detected on processed wafers using the invention.

This invention was tested in a production chamber of a major semiconductor manufacturer, where twenty five wafers are carried one-at-a-time by table 20 for each processing cycle. The tested embodiment provided a maximum temperature variation of 70° C. on stainless steel components as shown in FIG. 4d. Every four cycles, this manufacturer processed one test wafer in which the number of defects before and after the processing cycle were counted. The percentage of detected particles relative to the average number of particles counted during an average processing run without supplemental heating was plotted in FIG. 5 as a function of the number of wafers processed, with large particles (those over 0.7 μm) being shown with square dots and total particles (those over 0.25 μm) being shown with round dots. The actual number of particles counted during a typical production run is proprietary information of the manufacturer; however, the manufacturer did determine that the supplemental heater reduced large particles 97% over the average production lifetime of a kit, and 73% over 180% of normal shield production lifetime. Total particle reduction was 92% and 47% at the normal lifetime (100%) and 180% of normal shield lifetime marks. (For this manufacturer, the normal lifetime of a kit, comprising upper and lower shields and the clamp, is 3600 wafers. The spike in total particles at 3000 wafers occurred when the chamber remained idle for 24 hours and processing was restarted without normal particle reduction steps being undertaken prior to startup.) Even better results would be expected if the temperature variation could be kept under 65° C., as predicted by FIG. 3.

Many heater layouts are contemplated for the practice of the invention. Multiple heaters could be placed either on or adjacent the outer surface of upper shield 40, with multiple temperature monitors and feedback controls to keep the temperature of upper shield 40 as constant as desired during a processing cycle. Since the disclosed system already holds lower shield 30 at a more constant temperature than upper shield 40, it appears that there would be little advantage to also using additional heaters (or the bake-out lamps) to further control the temperature of lower shield 30 or table 20.

Many heater designs may be used in the practice of the invention. For example, two semi-circular quartz heating lamps could be mounted outside upper shield 40. The typical commercially available band heater is designed to be clamped on the outside of a round object to be heated; such devices could easily be clamped against the round outer surface of upper shield 40. Such heaters also could be clamped around the outer edge of lower shield 30, if a band heater on upper shield 40 had insufficient radiation to sufficiently heat other elements with which it was not in contact. Furthermore, a band heater could be constructed as an integral part of either or both shields 40, 30.

Alternatively, cooling lines could be used to reduce the temperature variations by cooling the upper and lower shields. The use of cooling equipment would eliminate the need for feedback control, but would greatly increase the complexity of changing the deposition shield kit.

Some chambers do not use a clamp 24. The invention will work equally well if clamp 24 is not present or if other structure is utilized in a chamber instead of clamp 24.

The particular sizes and equipment discussed above are cited merely to illustrate a particular embodiment of this invention. It is contemplated that the use of the invention may involve components having different sizes and shapes as long as the principle is followed of providing supplemental temperature control to hold the variations in temperature of elements within a deposition chamber, and particularly elements such as an upper shield which surrounds and is above the specimens being coated, within a predetermined range than prevents or severely reduces particle generation caused by the temperature variations. It is intended that the scope of the invention be defined by the claims appended hereto.

What is claimed is:

1. In a thin film processing method in a chamber having internal surfaces which undergo temperature variations during a process cycle in which a thin coating is applied from a source to the internal surfaces within line-of-sight of the source,
   said internal surfaces including:
      an inner wall of the chamber;
      a specimen;
      a table having a perimeter and an upper surface for holding the specimen below the source;
      a ring having an outer portion surrounding the perimeter of the table and a lip portion extending over a portion of the upper surface of the table; and
      a thin-walled, generally cylindrical, upper shield having a lower edge surrounding and spaced from the ring and an upper edge extending toward the source to shield the interior wall above the table from the thin coating, said shield having an outer surface extending between said upper and lower edges and facing away from the table;
   the important comprising reducing generation of particles from the internal surfaces by maintaining the temperature variation of the internal surfaces at a low enough value during the process cycle to keep thermal expansion stresses between the coating and the surfaces under 500 MPa by applying controllable supplemental heat to the outer surface of the upper shield above the table.

2. The method of claim 1 wherein the maximum temperature variation is about 70° C. for TiN deposits on stainless steel interior surfaces.

3. The method of claim 1 wherein the maximum temperature variation is about 45° C. for aluminum interior surfaces.

4. The method of claim 1 wherein the maintaining step further comprises:
   measuring the temperature of the shield; and
   controlling the supplemental heat based on the measured temperature.

5. The method of claim 4 wherein particles generated from the inner surface of the shield fall towards the table.

6. The method of claim 1 wherein said internal surfaces further include a thin-walled lower shield having an upper portion which encircles and is spaced from the lower portion of said upper shield, and a lower portion extending under said upper shield to support said ring.

7. The method of claim 6 wherein said supplemental heat is applied only from a heater mounted between said upper shield and the upper part of the lower shield.

8. In a thin film processing chamber which undergoes temperature variations during a processing cycle in which a thin film material is applied from a source to internal surfaces within line-of-sight of the source, said internal surfaces including an inner wall of the chamber, a specimen, a table for holding the specimen, a source of film material above and facing said table, and a generally thin-walled cylindrical upper shield surrounding the table and extending toward said source, said shield having an inner surface facing said table and an outer surface facing away from said table and shielding said inner wall above said table from said film material, wherein the improvement comprises:

means for applying supplemental heat to said outer surface of said shield; and means for controlling the supplemental heating to maintain the temperature variation of said shield sufficiently low to keep thermal expansion stresses of said internal surfaces under 500 MPa during a processing cycle.

9. The apparatus of claim 8 wherein the means for applying supplemental heat comprises a radiant heater facing said outer surface of said shield.

10. The apparatus of claim 9 wherein said radiant heater substantially encircles said shield.

11. The apparatus of claim 10 wherein said radiant heater comprises at least one resistive wire.

12. The apparatus of claim 11 wherein said means for controlling the supplemental heating comprises at least one temperature sensitive device affixed to said shield; said temperature sensitive device controlling the flow of electricity through said resistive wire in response to the temperature detected by said temperature sensitive device.

13. The apparatus of claim 8 wherein said means for controlling the supplemental heating comprises at least one temperature sensitive device affixed to said shield; said temperature sensitive device controlling the means for applying supplemental heat in response to the temperature detected by said temperature sensitive device.

14. The apparatus of claim 9 wherein said means for applying supplemental heat is turned on when a detected temperature on said shield is under a limit, and turned off when a detected temperature on said shield exceeds said limit.

15. The apparatus of claim 8 wherein said internal surfaces further include a clamp ring having an outer portion surrounding said table and a lip portion extending over a portion of an upper surface of said table for holding said specimen on said table.

16. The apparatus of claim 15 wherein said internal surfaces further include a thin-walled lower shield having an upper portion which encircles and is spaced from the lower portion of said upper shield, and a lower portion extending under said upper shield to support said clamp ring.

* * * * *